(12) United States Patent
Mettler et al.

(10) Patent No.: US 6,864,538 B2
(45) Date of Patent: Mar. 8, 2005

(54) PROTECTION DEVICE AGAINST ELECTROSTATIC DISCHARGES

(75) Inventors: Stephan Mettler, Munich (DE); Wolfgang Wilkening, Pfullingen (DE)

(73) Assignee: Robert Bosch GmbH, Stuttgart (DE)

(*) Notice: Subject to any disclaimer, the term of this patent is extended or adjusted under 35 U.S.C. 154(b) by 153 days.

(21) Appl. No.: 10/297,707

(22) PCT Filed: Apr. 14, 2001

(86) PCT No.: PCT/DE01/01471
§ 371 (c)(1),
(2), (4) Date: Dec. 6, 2002

(87) PCT Pub. No.: WO01/95395
PCT Pub. Date: Dec. 13, 2001

(65) Prior Publication Data
US 2003/0168682 A1 Sep. 11, 2003

(30) Foreign Application Priority Data
Jun. 6, 2000 (DE) ........................ 100 28 008

(51) Int. Cl.$^7$ ............................................. H01L 23/62
(52) U.S. Cl. ..................... 257/361; 257/173; 257/174; 257/362; 257/526; 257/557; 257/558; 257/560; 257/561; 257/562; 257/563; 257/564; 257/575; 257/583; 257/585; 257/590; 257/591; 257/592
(58) Field of Search ................. 257/526, 557–558, 257/560–564, 575, 583, 585, 590–592, 173–174, 361–362

(56) References Cited

U.S. PATENT DOCUMENTS

| 4,390,890 | A | | 6/1983 | Bergeron et al. |
|---|---|---|---|---|
| 4,595,943 | A | | 6/1986 | Morcom et al. |
| 5,159,427 | A | * | 10/1992 | Ogura et al. ................. 257/500 |
| 5,212,618 | A | * | 5/1993 | O'Neill et al. ................. 361/56 |
| 5,223,737 | A | * | 6/1993 | Canclini ...................... 257/546 |
| 5,268,588 | A | * | 12/1993 | Marum ........................ 257/362 |
| 5,341,005 | A | * | 8/1994 | Canclini ...................... 257/173 |
| 5,468,984 | A | * | 11/1995 | Efland et al. ................ 257/356 |
| 5,581,112 | A | * | 12/1996 | Li et al. ...................... 257/557 |
| 5,644,460 | A | * | 7/1997 | Clukey ......................... 361/56 |
| 5,953,600 | A | * | 9/1999 | Gris ............................ 438/200 |
| 6,147,852 | A | * | 11/2000 | Ravanelli ..................... 361/111 |
| 6,194,764 | B1 | * | 2/2001 | Gossner et al. ............. 257/355 |
| 6,303,964 | B1 | * | 10/2001 | Pulvirenti et al. ........... 257/355 |
| 6,320,232 | B1 | * | 11/2001 | Gossner et al. ............. 257/360 |
| 6,441,437 | B1 | * | 8/2002 | Gossner ...................... 257/355 |
| 6,570,229 | B1 | * | 5/2003 | Harada ........................ 257/373 |
| 6,680,493 | B1 | * | 1/2004 | Wolf et al. .................. 257/173 |

FOREIGN PATENT DOCUMENTS

| DE | 197 46 410 | 4/1999 | |
|---|---|---|---|
| DE | 199 17 155 | 6/2000 | |
| EP | 0 098 383 | 1/1984 | |
| EP | 0514060 A2 * | 5/1992 | ......... H01L/29/754 |
| EP | 0 532 481 | 3/1993 | |
| EP | 0 932 203 | 7/1999 | |
| JP | 2003092414 A * | 3/2003 | ......... H01L/29/861 |

* cited by examiner

Primary Examiner—Amir Zarabian
Assistant Examiner—Ida M. Soward
(74) Attorney, Agent, or Firm—Kenyon & Kenyon

(57) ABSTRACT

An ESD protection device encompassing a vertical bipolar transistor that is connected as a diode and has an additional displaced base area. The assemblage has a space-saving configuration and a decreased difference between snapback voltage and breakdown voltage.

20 Claims, 4 Drawing Sheets

PROTECTION DEVICE AGAINST ELECTROSTATIC DISCHARGES

FIELD OF THE INVENTION

The invention relates to a protective device.

BACKGROUND INFORMATION

German Published patent Application No. 197 46 410 discloses a protective device in which, in the event of electrostatic discharge (ESD), a vertically positioned transistor diode is made conductive by way of a lateral depletion-layer contact effect or "punch-through effect." In the protective device described therein, however, the breakdown voltage is typically twice as great as the "snapback voltage," i.e. the minimum voltage that must be present after breakdown between collector and emitter to ensure that the diode remains conductive.

SUMMARY OF THE INVENTION

The protective device according to the present invention has a smaller difference between a breakdown voltage and snapback voltage. This is because as a rule, protective structures which have a snapback voltage that is greater than the operating voltage of the circuit to be protected, and which has a breakdown voltage that is less than the technology-related dielectric strength of the circuit to be protected, are regarded as reliable. If it is necessary to connect two protective elements in series so that the snapback voltage is greater than the operating voltage, not only the snapback voltage but also the breakdown voltage then doubles. The resulting value for the breakdown voltage may, however, be too high for the circuit. The lateral diode preceding the base-emitter structure makes it possible to remain below a lower limit for the breakdown voltage, which hitherto was defined by the minimum field oxide extension between the base-emitter structure and the collector connection. In the context of series circuits of protective elements, this decreased breakdown voltage is therefore critical in terms of cost-effective utilization, so that even integrated circuits with high supply voltages can be protected. Combination (series connection) with other ESD protection elements is also improved, so that specific "protection windows" may be established (supply potential of the circuit to be protected as the lower limit for the snapback voltage, maximum permissible voltage of the circuit to be protected as the lower limit for the breakdown voltage).

An additional diode trough may be provided for the integrated lateral diode, thereby allowing the breakdown voltage of the protective assemblage to be further lowered.

In addition, the breakdown voltage may be further varied by adjusting the distance between the connector structure and the integrated lateral diode.

The provision of a recessed electrode allows improved contact between the buried layer and the collector electrode, and simultaneously ensures better protection of the circuit and surrounding circuit parts from mutual influences.

A connector layer of the connector structure may furthermore be selected such that the snapback voltage is suitably dimensioned substantially irrespective of the breakdown voltage.

DETAILED DESCRIPTION

Figure 1:
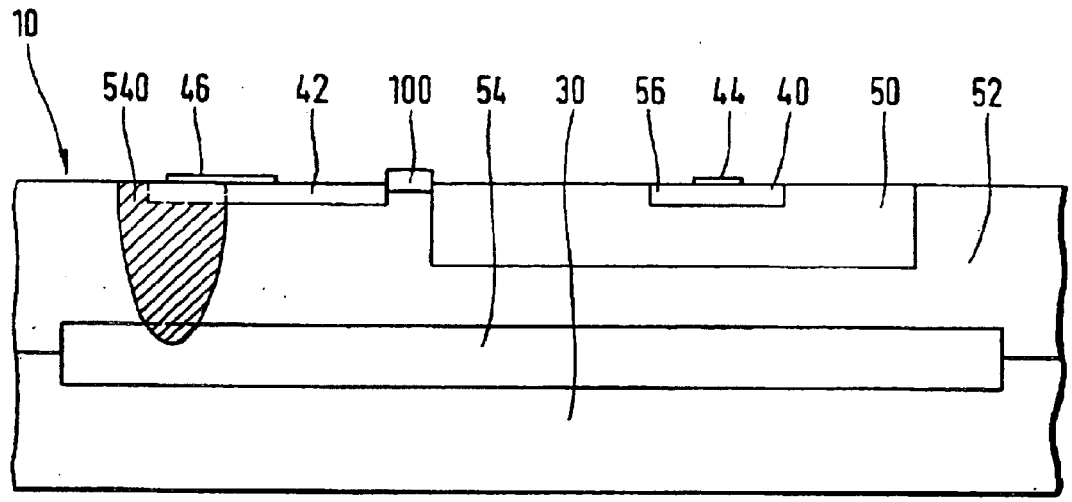
FIG. 1 is an assemblage illustrated in German Published patent Application No. 197 46 410.

FIG. 1 is a cross-sectioned side view of a protective device that is positioned on a p-doped semiconductor substrate 30. An n-doped surface area 52 is epitaxially applied onto substrate 30, a highly p-doped buried layer 54 being positioned between the surface area and the substrate. Introduced on surface 10 of surface area 52 is a p-doped trough 50 into which are in turn introduced a highly p-doped area 40 and, immediately adjacent thereto, a highly n-doped area 56, the two being electrically connected to one another via a metallic emitter electrode 44 on the surface. An insulating oxide layer 100 positioned on the surface separates p-trough 50 from a highly n-doped connector layer 42, introduced adjacently thereto into the surface, which may be electrically contacted via a collector electrode 46. Connector layer 42 overlaps with a highly n-doped recessed or "sinker" electrode 540, introduced into surface area 52, which in turn partially overlaps with buried layer 54. The doping of p-trough 50 is typically in the range of $10^{17}$ cm$^{-3}$. The n-doping of surface area 52 is typically in the range of $10^{15}$ cm$^{-3}$, and the doping of the highly n-doped connector layer typically in the range of $10^{19}$ cm$^{-3}$.

The blocking polarization of the p-n transition between p-trough 50 and surface area 52 is relevant in terms of utilization of a device of this kind for ESD protection. The distance between the p-trough and connector layer 42 is dimensioned such that the depletion zone in surface area 52, which expands with increasing blocking voltage, reaches connector layer 42 before the breakdown voltage between p-trough 50 and surface area 52 is attained. A breakdown thus occurs between trough 50 and connector layer 42 as a result of the depletion-layer contact effect.

Figure 2:
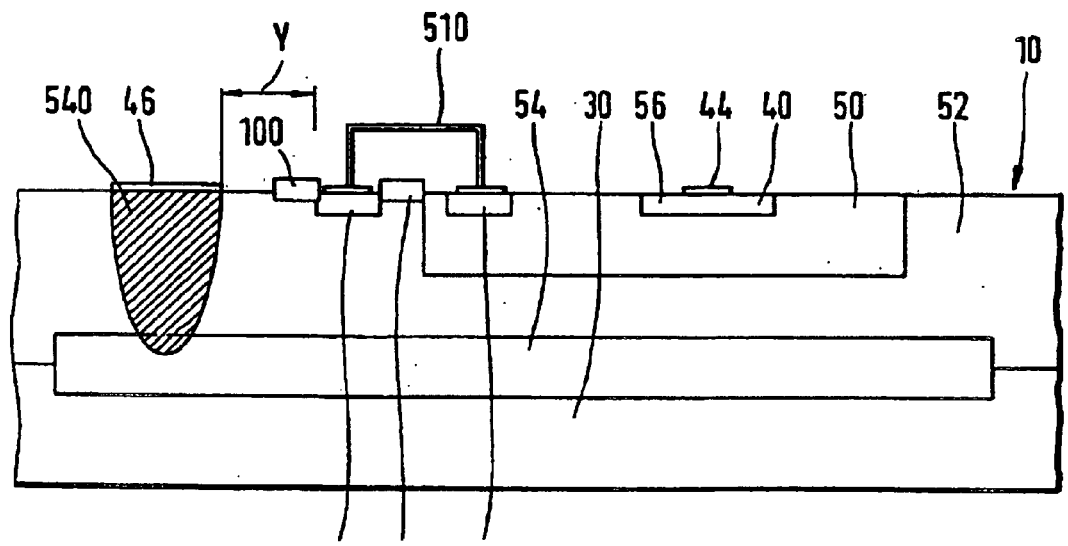
FIG. 2 is a side view section of a first exemplary embodiment.

FIG. 2 illustrates an exemplary embodiment of the protective device according to the present invention. Reference characters identical to those in FIG. 1 designate identical or similar components and are not described again below. A highly p-doped area 500 is introduced into surface area 52 between p-trough 50 and a connector structure (sinker electrode 540, collector electrode 46). Area 500 has a higher p-doping than trough 50; the dopant concentration in area 500 may be in a range of $5 \times 10^{19}$ to $10^{20}$ cm$^{-3}$. In addition, highly p-doped area 500 is of more planar configuration than p-trough 50, i.e. it does not protrude as deeply into surface area 52 as does p-trough 50. Area 500 is connected to p-trough 50 via an electrical connection 510. This connection 510 may be embodied as a metallic conductor on the surface of the semiconductor component, contacting of p-trough 50 being accomplished via a highly p-doped contact area 520 that is introduced into p-trough 50. An insulating oxide layer 530 is positioned between area 500 and p-trough 50 on surface 10 of the component. The connector structure (sinker electrode 540, collector electrode 461 is at a distance y from area 500, y being e.g. between 3 and 8 um.

The p-n transition between area 500 and surface area 52 results in formation of a lateral integrated diode that serves, when the component is laid out, as a protective device connected in the reverse direction. The negative pole of the circuit to be protected is connected to the emitter electrode, and the positive pole to the collector electrode. Once breakdown of this integrated lateral diode has occurred when a certain voltage value (the breakdown voltage) is exceeded, the base of the vertical transistor is activated such that the vertical transistor effect occurs. The component jumps to the characteristic snapback voltage of the vertical bipolar transistor; the lateral diode breakdown is canceled because the snapback voltage of the vertical transistor diode is lower than the diode breakdown voltage, and the vertical transistor remains activated. Area 500 may also, alternatively, be referred to as a "displaced base area." Because area 500 is more highly doped than base 50 and/or is more sharply delimited from surface area 52 because of its more planar configuration as compared to p-trough 50 (i.e. exhibits a greater dopant gradient with respect to surface area 52 than does p-trough 50), a greater electric field is achieved at a given voltage in the p-n transition of area 500 with surface area 52, and consequently the assemblage breaks down at a lower voltage.

The breakdown voltage may be lowered further by decreasing distance y. The distance may, however, be selected in very defined fashion in this context, since otherwise highly n-doped area 540 will approach too closely to highly p-doped area 500 and may thus reach the breakdown voltage very easily for utilization at low values. For y=8 um the breakdown voltage is approx. 37 volts, for y=7 um 34 volts, for y=6 um 25 volts, for y=5 um 13 volts, for y=4 um 7 volts, and for 7=3 um approximately 5 volts as illustrated examples. The snapback voltage of the assemblage may be determined solely by the vertical transistor and the resistance of the collector contact.

Sinker electrode 540 is not necessary for the operating principle of the assemblage and may therefore be omitted. In this case it is sufficient to provide a highly n-doped connector layer above which collector electrode 46 is positioned. The resistance of the collector contact is thereby slightly raised and thus the snapback voltage is also increased as compared to an assemblage having a sinker electrode, but the protective function is still ensured. A sinker electrode is, however, useful in order to delimit the protective device with respect to other circuits and thus to suppress parasitic effects and leakage currents into the substrate. Devices such as those illustrated in FIG. 2 may also be implemented with transposed doping types.

It is also possible to configure areas 500 and 50 in overlapping fashion. Insulating layer 530 is then omitted.

Figure 3:
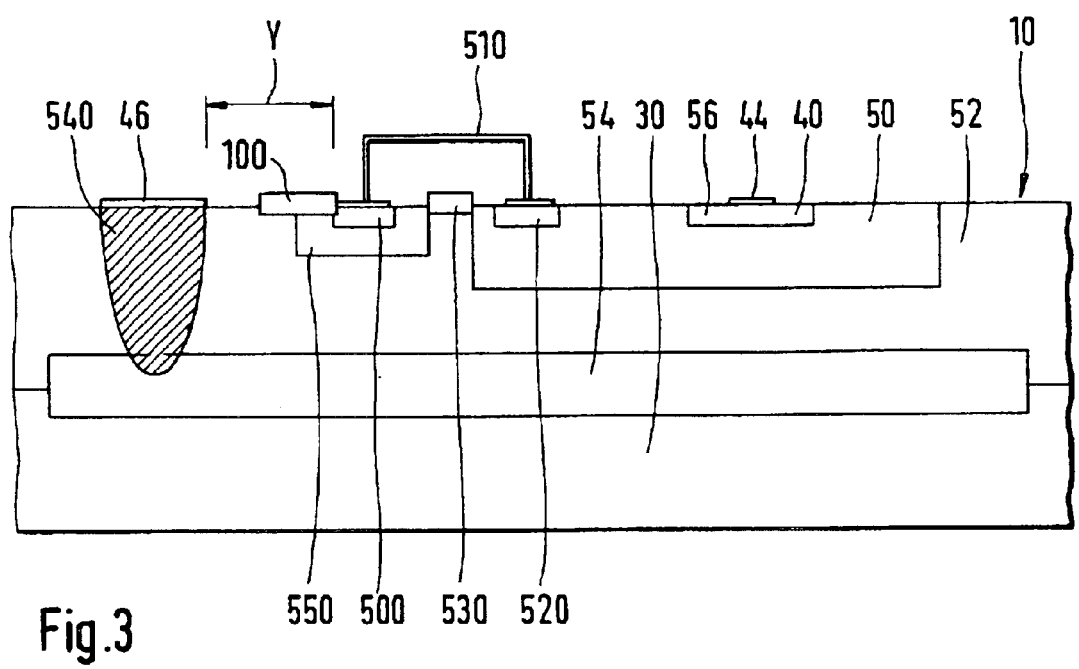
FIG. 3 is a side view section of second exemplary embodiment.

In contrast to FIG. 2, FIG. 3 illustrates a protective device in which displaced base area 500 is embedded into an n-doped trough 550 that is more highly doped than surface area 52. While the surface area, as already explained above, typically has a dopant concentration of $10^{15}$ cm$^{-3}$, trough 550 is doped at a concentration of approx. $10^{16}$ cm$^{-3}$ as an example.

The presence of n-trough 550 results in a sharper p-n transition between area 500 and the surrounding n-doped area than without this additional trough. This represents an additional contribution to lowering the breakdown voltage of the protective device, since because of the steeper p-n transition, a higher field at the p-n transition is achieved for a given voltage.

Figure 4:
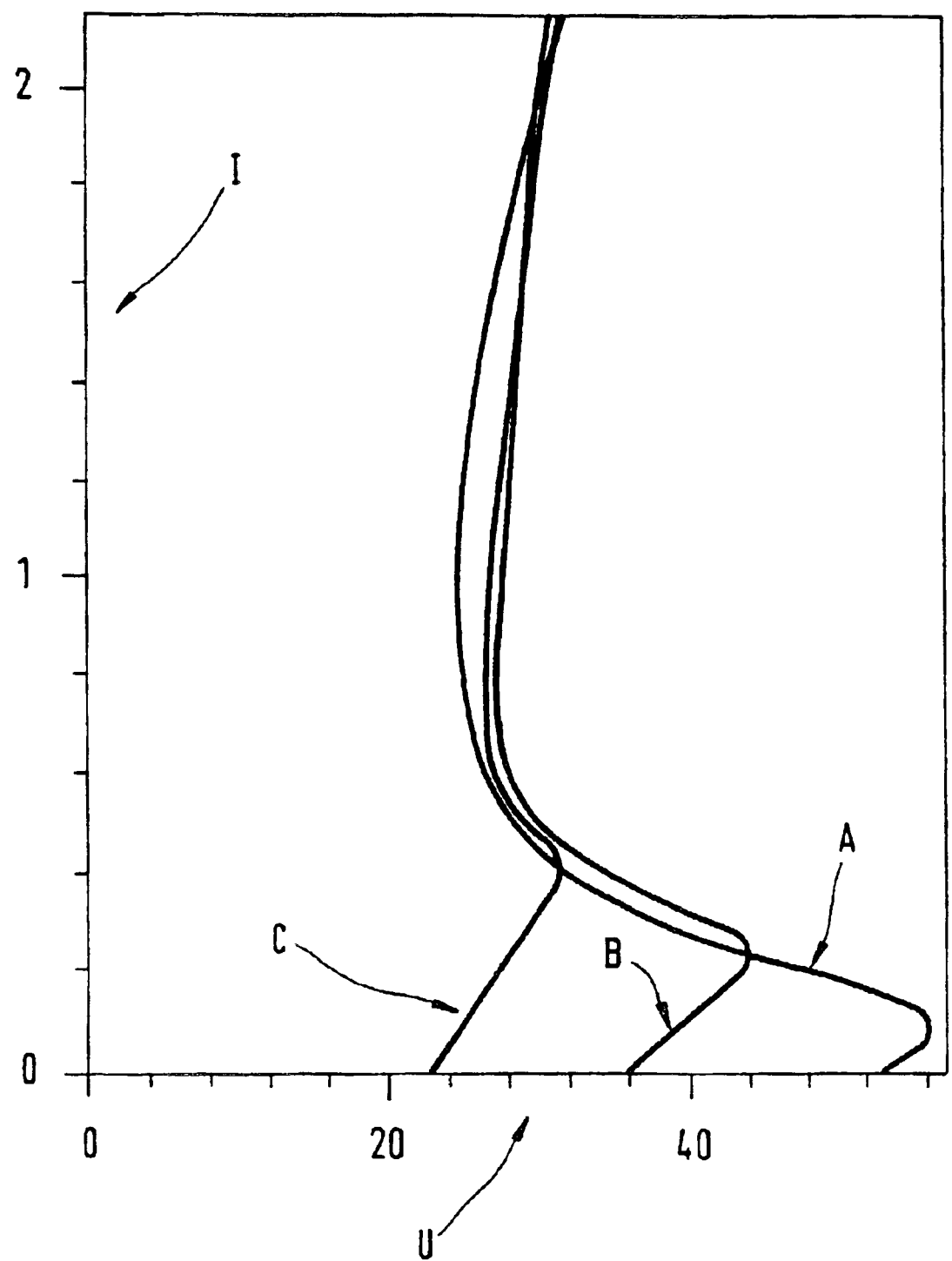
FIG. 4 is a current/voltage diagram.

FIG. 4 is a current/voltage diagram (in which I indicates current and U voltage) for the assemblages as illustrated in FIGS. 1 through 3. Curve A illustrates the profile for an assemblage as illustrated in FIG. 1, curve B the profile for an assemblage as illustrated in FIG. 2, and curve C for an assemblage as illustrated in FIG. 3.

For example, if the electrode of the assemblage of FIG. 1 is at ground and collector electrode 46 is at positive potential, curve A then illustrates that the p-n transition between base trough 50 and surface area 52 breaks down at a voltage of approximately 52 volts as a result of the depletion-layer contact effect at connector layer 42. Only when the voltage has risen thereafter to approximately 56 volts is there a flow of charge carriers around the emitter of the vertical transistor diode such that the p-n transition between emitter and base of the vertical transistor diode becomes conductive and a vertical current flows. In the range between 52 and 56 volts, therefore, at first an exclusively lateral current flows until, as a result of activation of the vertical transistor diode, the total resistance between collector and emitter decreases considerably and the voltage between those two electrodes correspondingly drops to a snapback voltage value in the range between 20 and 30 volts. Because of its higher doping and/or its more planar configuration, the preceding base area 500 causes an earlier breakdown and a correspondingly earlier onset of lateral current flow at a voltage between the collector and emitter electrodes of approximately 36 volts. The voltage range for purely lateral current flow is more distinct; in case B the voltage keeps rising to 44 volts until here again the transistor diode activates and the voltage between its electrodes drops to the snapback voltage value. The much lower breakdown voltage—approximately 44 volts as compared to approximately 56 volts with the assemblage—is clearly evident. Lastly, curve C illustrates the effect of n-trough 550 on the current/voltage profile: the onset of lateral current flow occurs at an even lower voltage of approx. 24 volts; and the breakdown voltage, i.e. the voltage at which the vertical current flow and thus a decrease in voltage to the snapback voltage begins, is also decreased further and is only approx. 31 volts.

Figure 5:
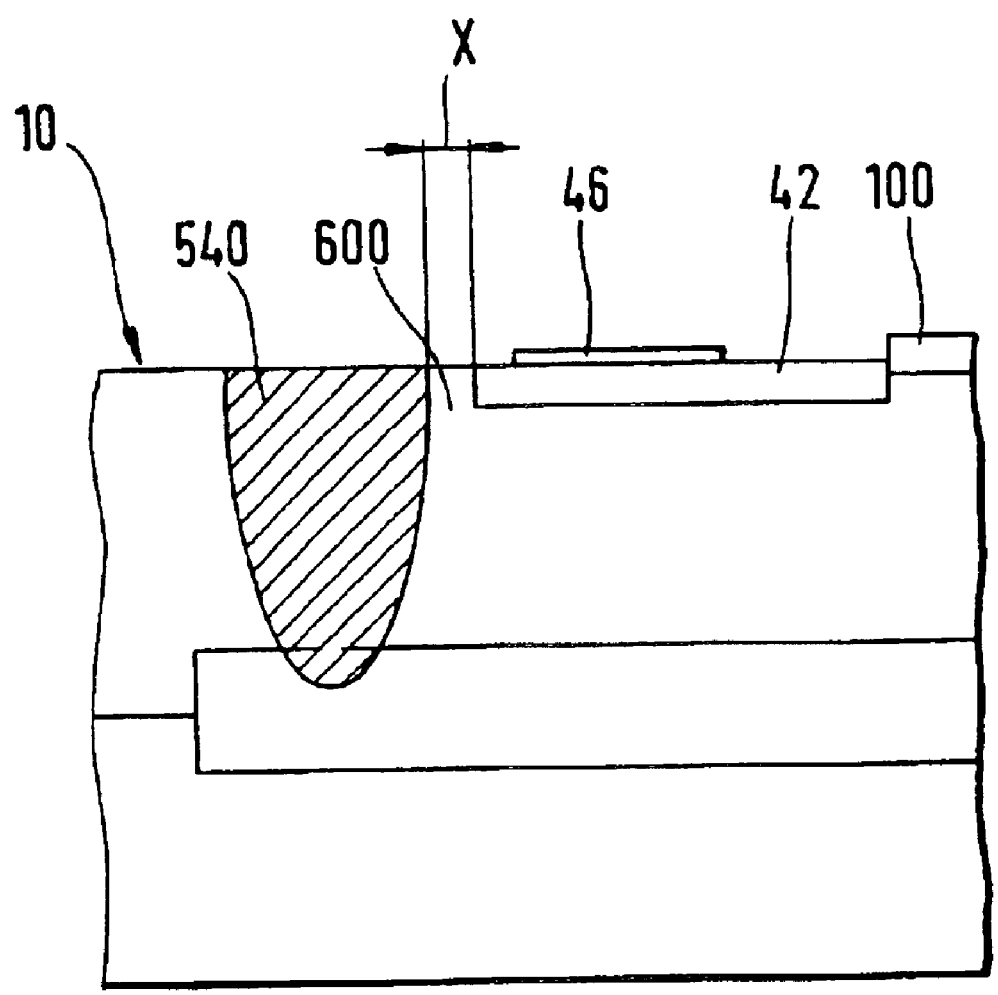
FIG. 5 is a further side view section of an exemplary embodiment.

FIG. 5 illustrates a variation of the circuit assemblages as illustrated in FIGS. 2 and 3 of German Published patent Application No. 199 17 155.6 but may also be applied to protective devicees having displaced base areas. The dashed line at the right edge of the illustration marks the boundary beyond which the assemblage is configured identically to FIG. 2 and FIG. 3. Only in the portion left of the dashed line, in contrast to FIGS. 2 and 3, is a separate connector layer 42 provided, which is highly n-doped and serves for attachment of collector electrode 46. What is essential here is the provision of a distance x between recessed electrode 540 and connector layer 42, thus creating an intermediate area 600 with dopant concentration which represents a local minimum between the recessed electrode and the connector layer.

As a result of the intermediate area, connector layer 42 is connected only in a very high-resistance manner to the buried layer, since any possible current flow between the connector layer and the buried layer extends through the surface area, which is lightly doped relative to the buried layer and the connector layer. The result of this, however, is that in the event of a breakdown, the transistor diode exhibits a higher snapback voltage as compared to the assemblage of FIGS. 2 and 3. The value of the snapback voltage is thus adjustable by way of the distance x between the connector layer and sinker electrode rises as x increases.

What is claimed is:

1. A protective device against electrostatic discharges, for an integrated circuit positioned in a semiconductor substrate, comprising:

a transistor diode positioned in a surface area vertically with respect to a surface of the semiconductor substrate and having a base-emitter structure that is introduced on the surface and a collector configured as a buried layer;

a connector structure configured to contact the buried layer and positioned in the surface area laterally offset with respect to the transistor diode so that when the transistor diode is polarized in a reverse direction, one of a depletion-layer contact and a "punch-through" occurs at the connector structure before a breakdown can occur between the surface area and the base-emitter structure; and a first area in the surface area arranged between the base-emitter structure and the connector structure, the first area having a doping type selected to be opposite to a doping type of the surface area, the first area being connected in a low-resistance configuration to the base-emitter structure so that a semiconductor transition between the first area and a part of the surface area surrounding the first area forms a lateral diode for activation of the transistor diode, wherein at least one of:

a dopant concentration in the first area is configured to be higher than in a base area of the base-emitter structure, and the first area is configured to be more planar than the base area.

2. The protective device according to claim 1, wherein the first area is positioned in a trough, oppositely doped and introduced into the surface area, which has a dopant concentration higher than that of the surface area.

3. The protective device according to claim 1, further comprising:

an insulating oxide layer positioned between the first area and the connector structure on a surface of the surface area.

4. The protective device according to claim 1, further comprising:

an insulating oxide layer positioned between the first area and the base-emitter structure.

5. The protective device according to claim 1, wherein a distance between the connector structure and the first area is dimensioned in accordance with a breakdown voltage of the transistor diode.

6. The protective device according to claim 1, wherein the connector structure includes a recessed electrode, introduced into the surface area, that overlaps with the buried layer and extends to the surface.

7. The protective device according to claim 6, wherein the connector structure includes:

a connector layer, and a collector electrode attached to the connector layer.

8. The protective device according to claim 7, wherein the connector layer is completely surrounded, on sides facing away from the surface, by regions of the surface area that have a lower doping than that of the connector layer, so that a current path between the buried layer and the connector layer extends through the regions.

9. The protective device according to claim 7, wherein a distance differing from zero between the recessed electrode and the connector layer is dimensioned in accordance with a snapback voltage of the transistor diode.

10. The protective device according to claim 7, wherein the semiconductor substrate is p-doped, and the surface area is configured as an n-doped epitaxial layer.

11. The protective device according to claim 10, wherein the base-emitter structure has a p-doped trough introduced into the surface area which forms a base of the transistor diode.

12. The protective device according to claim 11, further comprising:

a highly p-doped area configured to contact the p-trough; and a highly n-doped area, the highly p-doped area and the highly n-doped area introduced into the p-doped trough, the highly p-doped area and the highly n-doped area configured to be in electrical connection with one another via a metallic conductor.

13. The protective device according to claim 12, wherein the metallic conductor is an emitter electrode applied on the surface.

14. The protective device according to claim 10, wherein the buried layer is highly n-doped and is positioned between the semiconductor substrate and the surface area, extending at least beneath the base-emitter structure.

15. The protective device according to claim 7, wherein the buried layer is configured to further extend beneath the connector layer.

16. The protective device according to claim 7, wherein the connector layer is highly n-doped.

17. The protective device according to claim 10, wherein the connector layer is highly n-doped.

18. The protective device according to claim 6, wherein the recessed electrode is highly n-doped.

19. The protective device according to claim 10, wherein the recessed electrode is highly n-doped.

20. The protective device according to claim 10, wherein at least one of the transistor diode, the first area, the connector structure, and the semiconductor substrate includes transposed doping types.

* * * * *